United States Patent
Hallquist

(10) Patent No.: US 8,069,017 B2
(45) Date of Patent: Nov. 29, 2011

(54) METHOD OF INITIALIZING BOLT PRETENSION IN A FINITE ELEMENT ANALYSIS

(75) Inventor: John O. Hallquist, Livermore, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 676 days.

(21) Appl. No.: 12/238,237

(22) Filed: Sep. 25, 2008

(65) Prior Publication Data

US 2010/0076739 A1    Mar. 25, 2010

(51) Int. Cl.
  *G06F 17/50*   (2006.01)
  *G06G 7/48*    (2006.01)
(52) U.S. Cl. .................................. 703/1; 703/7
(58) Field of Classification Search ............... 703/1, 7–8
  See application file for complete search history.

(56) References Cited

U.S. PATENT DOCUMENTS

| 5,920,491 A | 7/1999 | Hibbitt et al. |
| 7,499,845 B1 * | 3/2009 | Quincy et al. ..................... 703/7 |

OTHER PUBLICATIONS

ABAQUS., "Analysis user's Manual Volum v: Prescribed Conditions, Constraints & Interactions" Version 6.5., 2004., 709 Pages.*
ABAQUS., "Getting Started with ABAQUS" version 6.5., 2004, p. 6-31, 7-5, 7-6, 8-1, 13-2, 13-3.*

* cited by examiner

*Primary Examiner* — Paul Rodriguez
*Assistant Examiner* — Eunhee Kim
(74) *Attorney, Agent, or Firm* — Roger H. Chu

(57) ABSTRACT

In one aspect of the invention, each bolt is modeled using a beam element in a FEA model. To apply desired pretension to one or more bolts, at least one pretension-versus-time curve is specified. Each pretension-versus-time curve includes ramp portion, desired pretension portion and optional unloading portion. Duration of the pretension-versus-time curve generally covers first 0.5-1% of total simulation time of a car crashworthiness analysis. Ramp portion starts from zero to desired pretension in a substantially linear manner, and hence being configured for applying desired pretension to a bolt gradually with smaller increments. Desired pretension portion is configured for ensuring the desired pretension can actually be applied to the beam element during an initialization process—a series of quasi-static analyses. Since the method is independent of the deformation of the beam, the method completely avoids the need to iteratively determine an axial strain or displacement that gives the desired pretension.

17 Claims, 5 Drawing Sheets

METHOD OF INITIALIZING BOLT PRETENSION IN A FINITE ELEMENT ANALYSIS

FIELD OF THE INVENTION

The present invention generally relates to a method, system and software product used in computer-aided engineering analysis, more particularly to a method of initializing bolt pretension independent of the axial strain in a finite element analysis for simulating structural responses of a structure with bolted joints included therein.

BACKGROUND OF THE INVENTION

Finite element analysis (FEA) is a computer implemented method widely used in industry to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA is becoming increasingly popular with automobile manufacturers for optimizing both the aerodynamic performance and structural integrity of vehicles. Similarly, aircraft manufacturers rely upon FEA to predict airplane performance long before the first prototype is ever developed. One of the popular FEA tasks is to simulate an impact event such as car or truck crashworthiness. A problem associated with crashworthiness simulation is to properly simulate bolted joints or connections between two parts especially in trucks.

General purpose of a bolted joint is to clamp two or more parts together. The clamping force is achieved by applying torque to the bolt head and the nut; the mechanical advantage of the wrench and threads allows one to actually stretch the section of the bolt between the head and the nut (an area known as the grip), creating tension in the bolt. This tension is known as pretension because it exists before any other forces are applied to the joint. The pretension is transmitted to the mating parts through the head, nut, and any washers that may be present. It squeezes the mating parts together, and if the joint is designed, assembled, and maintained properly, prevents the mating parts from separating or sliding under normal loads.

Pretension needs to be simulated realistically in order to simulate bolted joints or connections properly in a finite element analysis. Many prior art approaches are cumbersome and/or tedious for users not only in creation of the FEA model, but in actual simulation itself. In one example, a prior art approach requires users to specify each bolt with a pre-defined axial stretch. This can be accomplished is a number of ways, for example, including the use of a thermal gradient to create the stretch or simply setting the axial stress value corresponding to the predefined stretch. Since typical FEA models may contain hundreds of bolts in close proximity, the interactions that result leave many bolts with inaccurate pretensions. During the initialization stage of a simulation, users must pay special attention to ensure that the correct pretension is indeed achieved in each and every one of the bolts in the FEA model. This prior art approach may work when there are very limited number of bolts provided these bolts are not located in substantially different orientations. In another prior art approach, each bolt is represented by a beam element, whose axial stress is iteratively determined by prescribing the motion of two beam end nodes. When the desired axial stress is reached, constraints would then be introduced and used to create a rigid link between the two beam end nodes. The primary reason for bolt pretension not reaching the desired level is due to deformation of the plates or other components within the bolted joints. In another example, a very detailed bolt model may be required (e.g., a number of solid elements) to ensure pretension as internal stress.

Therefore, it would be desirable to have an improved method of initializing bolt pretension in a finite element analysis.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses a system, method and software product for numerically initializing bolt pretension independent of the axial strain in a finite element analysis. Pretension of a bolt in a bolted joint or connection is determined from physical data (e.g., torque of the wrench used for tightening the bolt). When there are more than one bolt in a structure (e.g., car, truck, etc.), each bolt may have a different pretension and may be situated in a different orientation. In one aspect of the present invention, each bolt is modeled using a beam element in a finite element analysis model. Each beam element includes two end nodes which correspond to the two ends of the bolt. To apply the desired pretension to one or more bolts, at least one pretension-versus-time curve is specified. Each pretension-versus-time curve includes a ramp portion, a desired pretension portion and an optional unloading portion. Duration of the pretension-versus-time curve generally covers first 0.5-1% of total simulation time (about 100 ms or 0.1 second) of a car crashworthiness analysis. Ramp portion starts from zero to the desired pretension in a substantially linear manner, and hence being configured for applying desired pretension to a bolt gradually with substantially smaller increments. Desired pretension portion is configured for ensuring the desired pretension can actually be applied to the beam element during an initialization process—a series of quasi-static analyses. Because the desired pretension in bolts can be imposed independent of the deformation of the beam or independent of axial strain, the method according to one aspect of the present invention overcomes the problems encountered in prior art approaches. In particular, the method of the present invention completely avoids the need to iteratively determine an axial strain or displacement used for deriving the desired pretension. Unloading portion is configured for signaling that desired pretension has been reached and applied to the bolt.

Quasi-static analysis may be conducted through either dynamic relaxation or implicit solution. In anther aspect, termination of bolt pretension can be determined by checking global structural energy (i.e., internal and/or kinetic energy equilibrium during solution cycles corresponding to the desired pretension portion of the pretension-versus-time curve. Once the global structural energy equilibrium has been detected or determined, the initialization of bolt pretension is accomplished and terminated. During the ramp portion of the loading, global energy is increasing. Energy equilibrium becomes possible after all bolts have been loaded to the desired pretension portion of the curve.

According to one embodiment, the present invention is an improved method of initializing bolt pretension independent of axial strain in a finite element analysis for simulating structural responses of a structure with bolted joints included therein, the method comprises at least the following: defining one or more bolts, each as a beam element in a finite element analysis model of the finite element analysis; defining at least one pretension-versus-time curve for specifying desired pretension of said each of the one or more bolts, wherein the at least one pretension-versus-time curve comprises a ramp portion, a desired pretension portion and an optional unloading portion; conducting a first series of quasi-static analyses at solution cycles covering the ramp portion of the pretension-versus-time curve in the finite element analysis; conducting a second series of quasi-static analyses at solution cycles covering the desired pretension portion of the pretension-versus-time curve in the finite element analysis; and achieving of the initializing bolt pretension by terminating the second series of quasi-static analyses when either of first and second bolt pretension termination conditions has been detected and determined.

The method of conducting the second series of quasi-static analyses further comprises: incrementing solution time at new solution cycle; identifying a group of bolts to be excluded in the new solution cycle; and performing one of a second series of quasi-static analyses without the group of bolts to be excluded until the solution time exceeds the end of the desired pretension portion, wherein the group of bolts to be excluded is determined by identifying which one of the one or more bolts that has been detected and determined to become unloaded. The first bolt pretension initialization termination condition comprises global structural energy equilibrium, while the second bolt pretension initialization termination condition comprises all of said one or more bolts have been detected and determined to become unloaded.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

Figure 1:
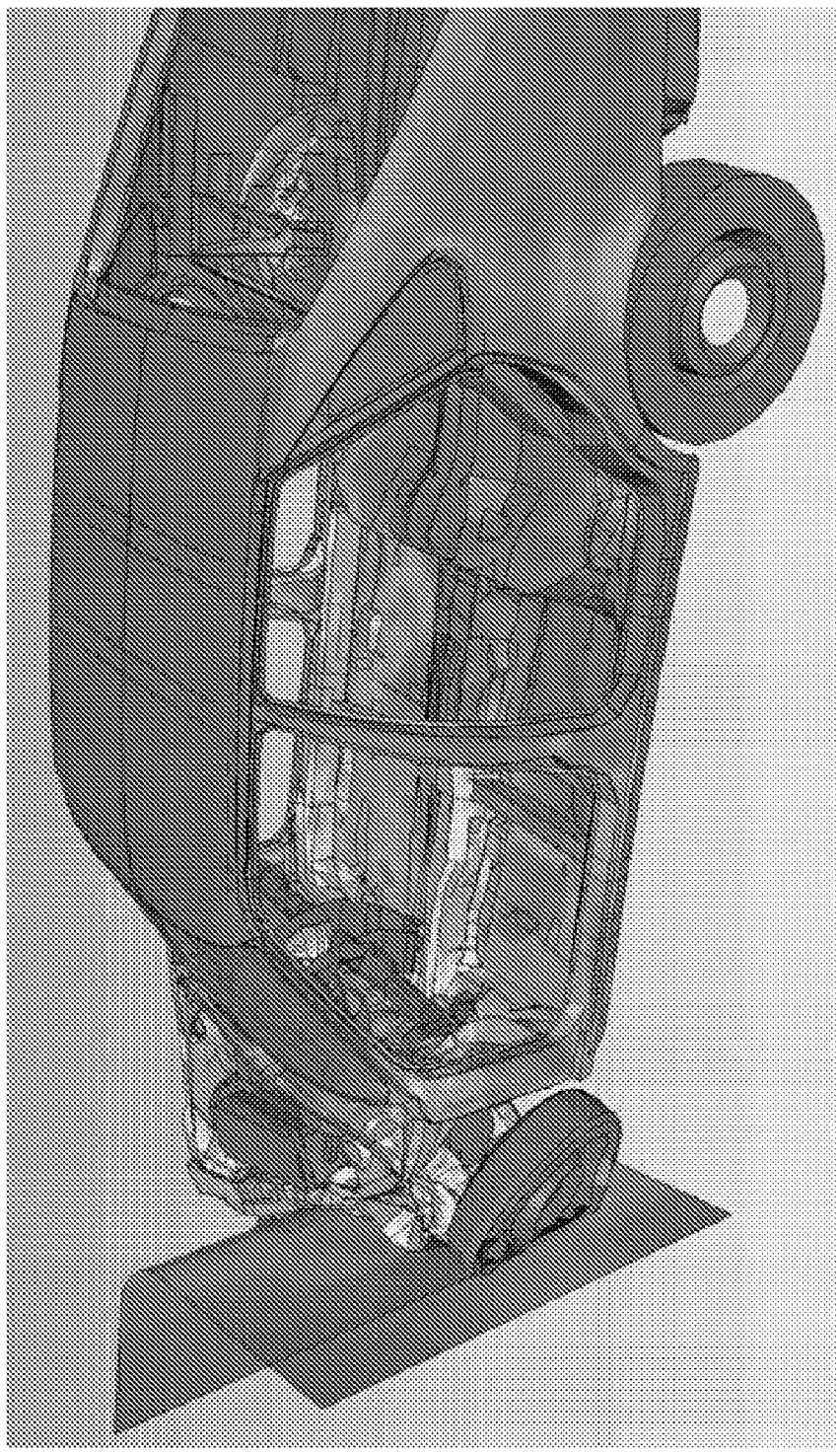
FIG. 1 is a diagram showing an exemplary finite element analysis result of a car crashworthiness simulation, in which one embodiment of the present invention may be included.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA or solution refers to $Ku=F$, where K is the effective stiffness matrix, u is the unknown displacement array and F is the effective loads array. F is a right hand side loads array while K is a left hand side stiffness matrix. The solution is performed at the global level with a factorization of the effective stiffness matrix, which is a function of the stiffness, mass and damping. One exemplary solution method is the Newmark time integration scheme.

Explicit FEA refers to $Ma=F$, where "M" is the diagonal mass array, "a" is the unknown nodal acceleration array and "F" is the effective loads array. The solution can be carried out at element level without factorization of a matrix. One exemplary solution method is called the central difference method.

Beam element refers to a one-dimensional finite element defined by two end nodes. The beam carries an axial stress and three shear stresses that may vary across the cross section, when the beam is under straining force. Axial strain of the beam is defined as amount of stretch in the axial direction of the beam. For example, when a beam is stretched from original length L to an elongated length (L+δ) by a tension axial force, the axial strain ϵ is defined as the total elongation δ per unit length (i.e., $\epsilon=\delta/L$).

Embodiments of the present invention are discussed herein with reference to FIGS. 1-7. However, those skilled in the art will readily appreciate that the detailed description given herein with respect to these figures is for explanatory purposes as the invention extends beyond these limited embodiments.

Referring first to FIG. 1, an exemplary finite element analysis result of a car crashworthiness simulation is shown. A car crash simulation is a virtual recreation of a destructive crash test of a car using computer simulation, which is generally performed using finite element analysis. Some parts in engine compartment of a car and many components (e.g., engine, trailer, etc.) in a truck are connected or jointed together by bolts. In order to simulate these bolted joints properly, the bolted joints must be modeled realistically with pretension in the bolts. The pretension of each bolt in a bolted joint or connection can be derived from torque used in a wrench used for tightening the bolt. Although the result shown in FIG. 1 is for a sedan crashed to a barrier, those of ordinary skill in the art understand that other types of automobiles (e.g., trucks, sports cars, vans, etc.) can be used and/or other types of collisions such as side impact, rollover may be involved.

Figure 2:
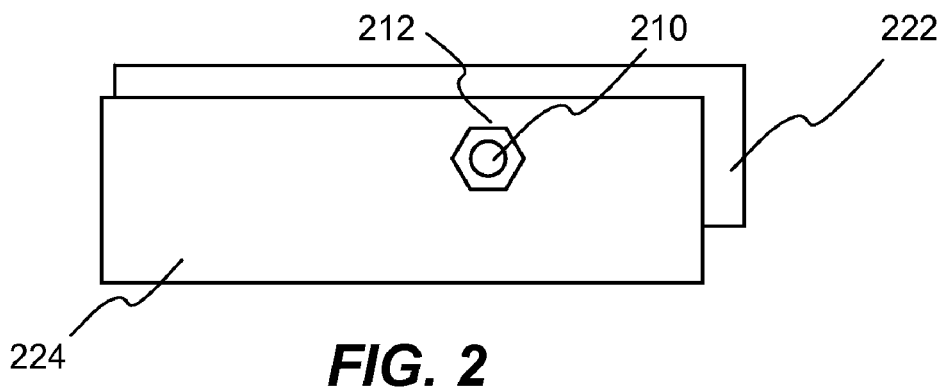
FIG. 2 is a view in axial direction of an exemplary bolt in a bolted joint, in which bolt pretension may be numerically modeled using one embodiment of the present invention.
Figure 3:
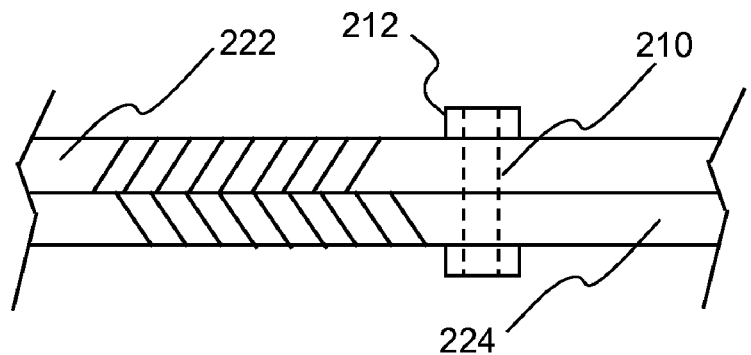
FIG. 3 is a view in radial (side) direction of the exemplary bolt of FIG. 2.

FIG. 2 shows a view in axial direction of an exemplary bolt 210 in bolted joint or connection. The bolt 210 is secured by a pair of nuts 212 for tightening two parts 222 and 224. The side view of the bolted joint is shown in FIG. 3. According to one embodiment of the present invention, the pretension in the bolt 210 set by torque wrench can be numerically modeled in a finite element analysis to realistically simulate a car/truck crash event. Although only one bolt 210 is shown in FIGS. 2 and 3, there may be more than one bolt in a car/truck model. Further, each of the bolts may be situated in different orientation.

Figure 4:
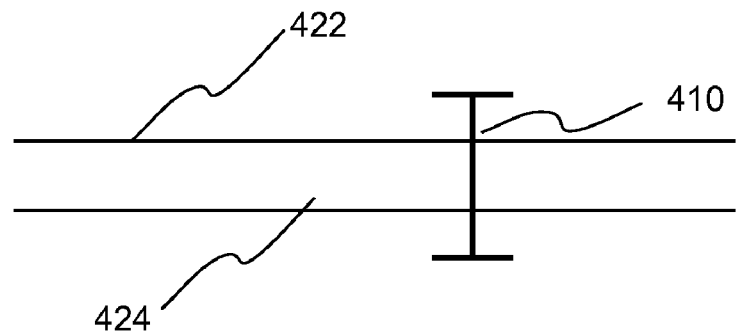
FIG. 4 is a diagram showing an exemplary beam element model of the bolt of FIG. 3, according to an embodiment of the present invention.
Figure 5:
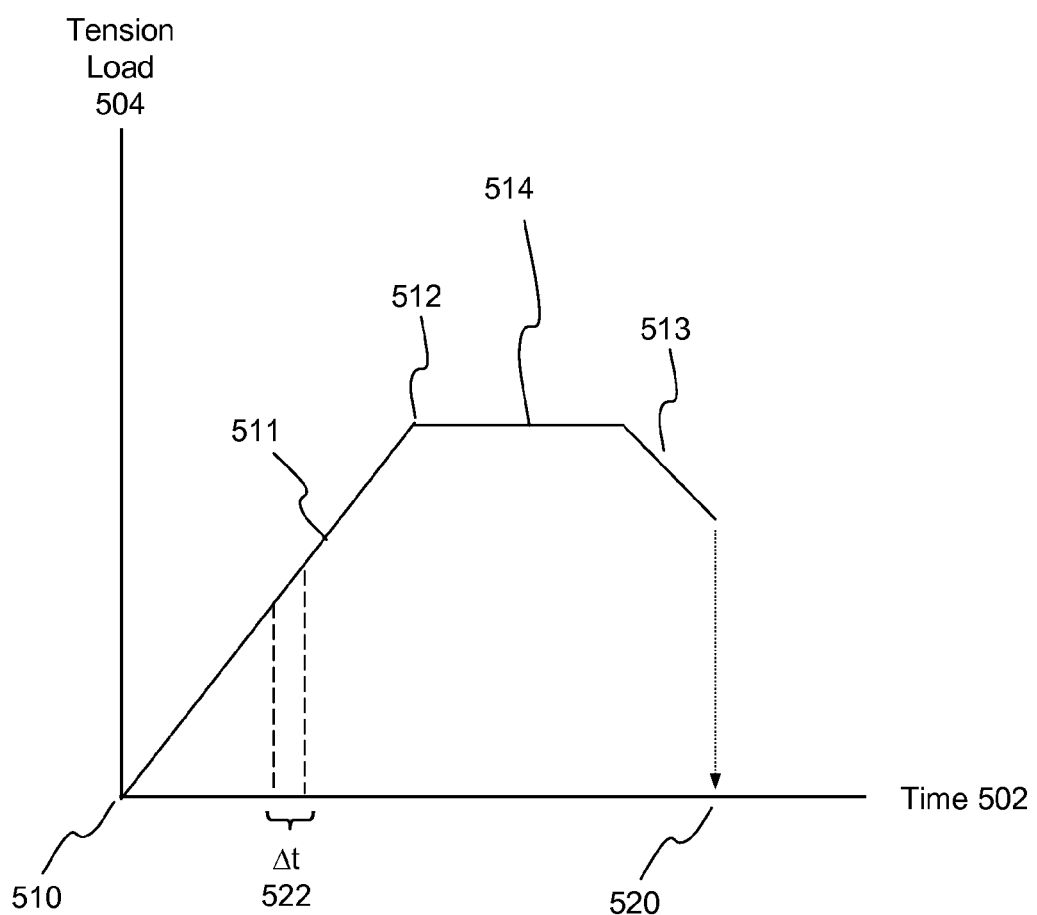
FIG. 5 is a diagram showing an exemplary pretension-versus-time curve configured for specifying desired pretension of a bolt in accordance with one embodiment of the present invention.

FIG. 4 shows a finite element model of the bolt 210 using a beam element 410. The parts 222 and 224 are modeled with other types of elements (e.g., shells, solids) 424 and 424. The beam element 410 needs to be initialized with the desired pretension so that a realistic car/truck simulation can be conducted. To apply the desired pretension, a pretension-versus-time curve (i.e., load curve) for each beam element (i.e., bolt) is specified and used. An exemplary pretension-versus-time curve 500 is shown in FIG. 5, according to an embodiment of the present invention.

The pretension-versus-time curve 500 is defined by horizontal time axis 502 and vertical tension load axis 504. The curve 500 starts at origin 510, in which tension load is set to be zero initially at time zero. The curve 510 follows a ramp portion 511 until desired pretension 512 is reached. A short horizontal desired pretension portion 514 (i.e., horizontal portion) then follows until the curve 500 enters an optional unloading portion 513. The entire duration of the pretension-versus-time curve 500 is generally configured to be first 0.5-1% of total time of a car/truck crash worthiness simulation, which lasts about 100 ms or 0.1 second. Since the pretension-versus-time curve 500 starts at time zero. The pretension-versus-time curve 500 ends at time 520, which corresponds to the duration of pretension initialization process. As shown in FIG. 5, loading phase of the pretension-versus-time curve 500 includes ramp portion 511 and desired pretension portion 514.

One of the reasons to have a ramp portion 511 in the pretension-versus-time curve 500 is to ensure that the tension load or pretension is incrementally and cumulatively applied to the corresponding beam element, so that quasi-static solution at each incremental solution time converges relatively faster. Each incremental quasi-static solution step may be controlled by incrementing the solution time by a time step or increment Δt 522. Further, high frequency modes of the FEA model during loading phase in the ramp portion 511 can be damped out very quickly, when damping (e.g., Rayleigh stiffness damping and/or contact damping) is applied. Applying damping is optional and can be turned off after the initialization process has been terminated.

One of the indicators for terminating bolt pretension initialization is to check whether global structural energy (e.g., internal energy, kinetic energy, etc.) equilibrium has been reached during the solution cycles corresponding to the desired pretension portion 514. Once the equilibrium has been detected and determined, the initialization process is ended. In other words, a termination condition of the initialization of bolt pretension has been reached. No further initialization will be required.

While the global energy equilibrium is used as termination indicator of the entire bolt pretension initialization process, there is another indicators used for terminating the initialization for each individual bolt. This is achieved when unloading has occurred at the unloading portion 513. When unloading portion 513 is not explicitly defined in the curve 500, the end of the desired pretension portion 514 is used as an indicator of unloading.

Each of the pretension bolts defined in the finite element model is associated with a pretension-versus-time curve 500. This can be achieved in many ways, for example, one curve for all of the bolts, one curve per bolt, or a number of curves each for one or more bolts. In other words, user may group bolts having same desired pretension as one particular type such that one particular pretension-versus-time curve can be associated with that type. Initializing of bolt pretension of entire FEA model require all of the bolts in the model have been initialized, which means termination condition for each bolt has been reached in the corresponding pretension-versus-time curve. The entire bolt pretension initialization ends, when all of the bolts have reached the unloading portion 513 of the pretension-versus-time curve 500. Bolts located in different regions of a structure can be initialized using different pretension-versus-time curves, for example, bolts in a stiffer region (e.g., engine mount) can be initialized in a relatively shorter time (e.g., using a shorter ramp portion) while bolts in a more flexible region may require longer ramp portion.

Figure 6:
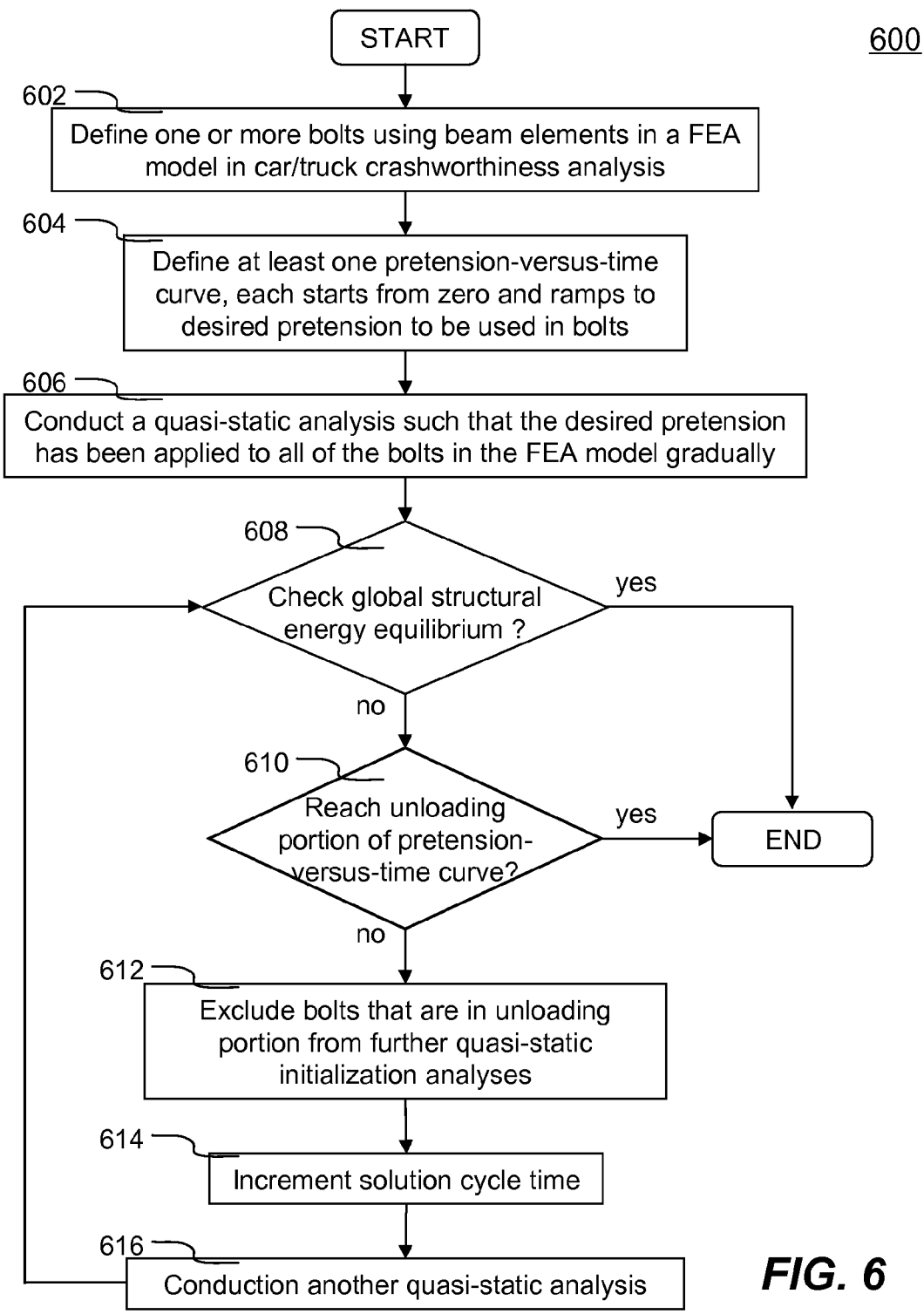
FIG. 6 is a flowchart illustrating an exemplary process of initializing bolt pretension independent of axial strain in a finite element analysis, according to an embodiment of the present invention.

Referring now to FIG. 6, a flowchart is shown an exemplary process 600 of initializing bolt pretension in a finite element analysis, according to an embodiment of the present invention. Process 600 may be implemented in software, hardware or a combination of both.

Process 600 starts by defining one or more bolts. Each bolt is represented by a corresponding beam element in a finite element analysis model of a car or truck at step 602. Next, at step 604, at least one pretension-versus-time curve (e.g., load curve shown in FIG. 5) is defined. Characteristics of the pretension-versus-time curve include a ramp portion, a desired pretension portion, and an optional unloading portion. Each of the bolts defined in the finite element analysis model is associated with and assigned a particular one of the at least one pretension-versus-time curve. Then a pretension initialization procedure is embarked in step 606 by conducting a series of quasi-static analyses covering the ramp portion of the pretension-versus-time curve. In other words, pretension of a beam element is incrementally and cumulatively applied in the series of quasi-static analyses. Each of the quasi-static analyses adds a portion of the desired pretension until the desired pretension has been reached in the beam element (i.e., bolt). Incrementally applying internal tension load minimizes dynamic responses of the finite element analysis model. Once the end of the ramp portion has been reached, the global structural energy equilibrium is checked at test 608. If the equilibrium is reached, process 600 ends.

During a loading phase of the initialization process, the tension load specified in the pretension-versus-time curve is used to calculate axial stress of the corresponding beam element, which overrides the computed axial stress. The desired pretension is reached independently of the computed axial strain in the beam. The loading phase includes the ramp portion and the constant desired pretension portion of the pretension-versus-time curve.

If it is determined that the equilibrium has not been reached at test 608, process 600 moves to test 610 after each quasi-static analysis. It is determined whether end time of the pretension-versus-time curve has been reached. If there are more than one pretension-versus-time curves defined, then the test 610 needs to be applied to each and every one of the pretension-versus-time curves. In other words, test 610 is to ensure each and every bolt defined in the finite element model to be initialized to the desired pretension. If 'no', process 600 moves to step 612, in which any bolt that is in an unloading phase (i.e., has reached desired pretension and started showing unloading behavior) is excluded from further quasi-static analyses in the pretension initialization procedure. Many known methods may be used to accomplish this. For example, any bolt that fits such criterion may be flagged or marked so that no further pretension initialization needs to be applied to the flagged bolts or beam elements.

At next step 614, solution time is incremented (e.g., a time increment Δt) before another quasi-static analysis is conducted at newly incremented solution time at step 616. Process 600 then returns to test 608 to check the global structural energy equilibrium. If the equilibrium has not been reached, test 610 and steps 612, 614 and 616 are repeated until test 610 become 'yes'. Process 600 ends.

It is noted that quasi-static analysis may be performed using either dynamic relaxation technique or implicit analysis. It is also noted that other quasi-static initialization are also taking place simultaneously. For example, gravity loading of suspension system and inflation of automobile tires to desired pressure.

Figure 7:
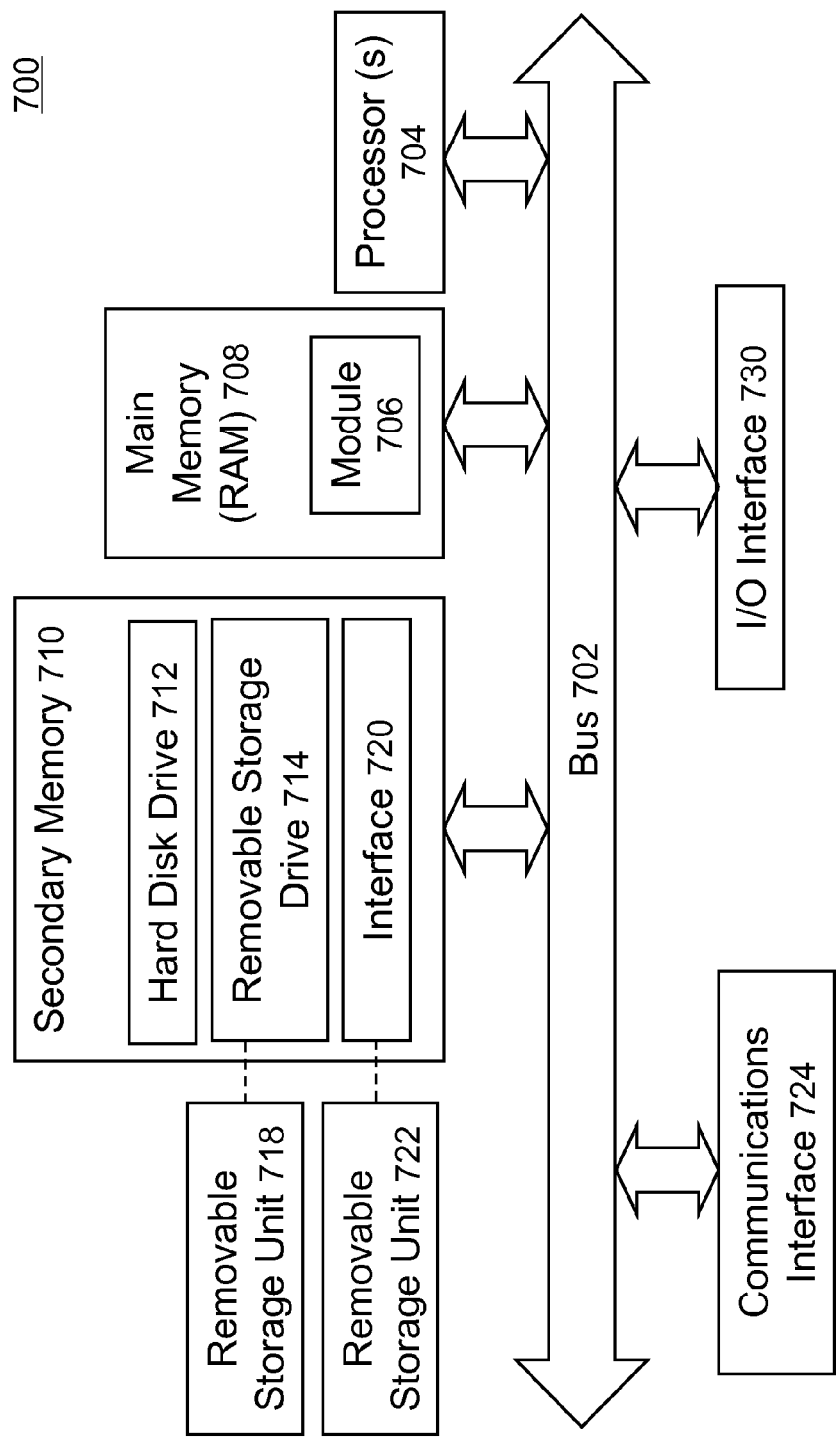
FIG. 7 is a function diagram showing salient components of a computing device, in which an embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services. Exemplary OS includes Linux®, Microsoft Windows®.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. Software and data transferred via communications interface 724 are in the form of signals 728 which may be electronic, electromagnetic, optical, or other signals capable of being received by communications interface 724. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium" and "computer usable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the finite element analysis (e.g., car crashworthiness) is reported to the user via the I/O interface 730 either in a text or in a graphical representation Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas beam element of a finite element analysis model has been shown and described, other types or forms of one-dimensional finite element may be used to achieve the same (e.g., a truss element which has a uniform axial stress and does not carry shear stresses). Furthermore, whereas the pretension-versus-time curve has been shown and described, other equivalent forms or techniques may be used, for example, a lookup table, a closed form equation, etc. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. An improved method of initializing bolt pretension independent of axial strain in a finite element analysis for simulating structural responses of a structure with bolted joints included therein, the method comprising:
    defining one or more bolts, each as a beam element in a finite element analysis model of the finite element analysis having a plurality of solution steps in time;
    defining at least one pretension-versus-time curve for specifying desired pretension of said each of the one or more bolts, wherein the at least one pretension-versus-time curve comprises a ramp portion, a desired pretension portion and an optional unloading portion;
    conducting a first series of quasi-static analyses at a first set of the solution steps covering the ramp portion of the pretension-versus-time curve;
    conducting a second series of quasi-static analyses at a second set of the solution steps covering the desired pretension portion of the pretension-versus-time curve, at each of said second set of the solution steps, incrementing current time in the finite element analysis by a time step ($\Delta t$), identifying a group of bolts to be excluded and performing one of said second series of quasi-static analyses without the group of bolts to be excluded until the current time exceeds the desired pretension portion's end time; and
    achieving of the initializing bolt pretension by terminating the second series of quasi-static analyses when either of first and second bolt pretension termination conditions has been detected and determined.

2. The method of claim 1, wherein the finite element analysis model is configured for representing a car or truck in a crashworthiness simulation.

3. The method of claim 1, wherein said each of the one or more bolts corresponds to one of at least one pretension-versus-time curve.

4. The method of claim 1, wherein the ramp portion is so configured that the desired pretension is applied to said each of the one or more bolts gradually in substantially smaller increments.

5. The method of claim 1, further comprises overriding computed axial stress in the beam element during each of the first and second series of quasi-static analyses.

6. The method of claim 1, further comprises applying damping in the first and second series of quasi-static analyses so that high frequency modes of structural response can are damped out.

7. The method of claim 1, wherein the group of bolts to be excluded is determined by identifying which one of the one or more bolts that has been detected and determined to become unloaded.

8. The method of claim 1, wherein the first bolt pretension initialization termination condition comprises global structural energy equilibrium.

9. The method of claim 1, wherein the second bolt pretension initialization termination condition comprises all of said one or more bolts have been detected and determined to become unloaded.

10. A non-transitory computer-readable storage medium containing instructions for controlling a computer system to perform a method of initializing bolt pretension independent of axial strain in a finite element analysis for simulating structural responses of a structure with bolted joints included therein, said method comprising:
    defining one or more bolts, each as a beam element in a finite element analysis model of the finite element analysis having a plurality of solution steps in time;
    defining at least one pretension-versus-time curve for specifying desired pretension of said each of the one or more bolts, wherein the at least one pretension-versus-time curve comprises a ramp portion, a desired pretension portion and an optional unloading portion;
    conducting a first series of quasi-static analyses at a first set of the solution steps covering the ramp portion of the pretension-versus-time curve;
    conducting a second series of quasi-static analyses at a second set of the solution steps covering the desired pretension portion of the pretension-versus-time curve, at each of said second set of the solution steps, incrementing current time in the finite element analysis by a time step ($\Delta t$), identifying a group of bolts to be excluded and performing one of said second series OF quasi-static analyses without the group of bolts to be excluded until the current time exceeds the desired pretension portion's end time; and
    achieving of the initializing bolt pretension by terminating the second series of quasi-static analyses when either of first and second bolt pretension termination conditions has been detected and determined.

11. The non-transitory computer-readable storage medium of claim 10, the method further comprises overriding computed axial stress in the beam element during each of the first and second series of quasi-static analyses.

12. The non-transitory computer-readable storage medium of claim 10, the method further comprises applying damping in the first and second series of quasi-static analyses so that high frequency modes of structural response are damped out.

13. The non-transitory computer-readable storage medium of claim 10, wherein the group of bolts to be excluded is determined by identifying which one of the one or more bolts that has been detected and determined to become unloaded.

14. A system for initializing bolt pretension independent of axial strain in a finite element analysis for simulating structural responses of a structure with bolted joints included therein, the system comprising:
a main memory for storing computer readable code for an application module;
at least one processor coupled to the main memory, said at least one processor executing the computer readable code in the main memory to cause the application module to perform operations of:
defining one or more bolts, each as a beam element in a finite element analysis model of the finite element analysis having a plurality of solution steps in time;
defining at least one pretension-versus-time curve for specifying desired pretension of said each of the one or more bolts, wherein the at least one pretension-versus-time curve comprises a ramp portion, a desired pretension portion and an optional unloading portion;
conducting a first series of quasi-static analyses at a first set of the solution steps covering the ramp portion of the pretension-versus-time curve;
conducting a second series of quasi-static analyses at a second set of the solution steps covering the desired pretension portion of the pretension-versus-time curve, at each of said second set of the solution steps, incrementing current time in the finite element analysis by a time step ($\Delta t$), identifying a group of bolts to be excluded and performing one of said second series of quasi-static analyses without the group of bolts to be excluded until the current time exceeds the desired pretension portion's end time; and
achieving of the initializing bolt pretension by terminating the second series of quasi-static analyses when either of first and second bolt pretension termination conditions has been detected and determined.

15. The system of claim 14, further comprises the operations of overriding computed axial stress in the beam element during each of the first and second series of quasi-static analyses.

16. The system of claim 14, further comprises the operations of applying damping in the first and second series of quasi-static analyses so that high frequency modes of structural response are damped out.

17. The system of claim 14, wherein the group of bolts to be excluded is determined by identifying which one of the one or more bolts that has been detected and determined to become unloaded.

* * * * *